United States Patent [19] [11] 4,080,601

Alcorn, Jr. [45] Mar. 21, 1978

[54] RADIO FREQUENCY FILTER NETWORK HAVING BANDPASS AND BANDREJECT CHARACTERISTICS

[75] Inventor: Lloyd C. Alcorn, Jr., Waco, Tex.

[73] Assignee: Wacom Products, Incorporated, Waco, Tex.

[21] Appl. No.: 672,645

[22] Filed: Apr. 1, 1976

[51] Int. Cl.[2] ....................... H03H 7/10; H03H 13/00; H01P 7/06; H04B 1/40

[52] U.S. Cl. ....................................... 343/180; 325/24; 333/73 W; 333/83 R

[58] Field of Search ................ 333/73 R, 73 C, 73 W, 333/82 B, 83 R; 343/180; 325/24

[56] References Cited

U.S. PATENT DOCUMENTS

| | | | |
|---|---|---|---|
| 3,537,041 | 10/1970 | Kommrusch | 333/83 |
| 3,815,137 | 6/1974 | Kaegebein | 343/180 |
| 3,876,963 | 4/1975 | Graham | 333/82 B |

*Primary Examiner*—Robert L. Griffin

*Assistant Examiner*—Marc E. Bookbinder

*Attorney, Agent, or Firm*—Fidelman, Wolffe & Waldron

[57] ABSTRACT

In a filter network a common coupling element provides input of radio frequency energy to both an odd quarter wavelength resonant cavity and a variable reactance isolating the coupling element from ground. The resonant cavity presents an open circuit to a selected pass frequency and the variable reactance shunts energy to ground at a selected reject frequency. In a duplexer for radio transmitter and receiver, a filter network attaches to the transmission line between transmitter and antenna junction; the cavity is tuned to the transmitter carrier; the variable reactance is tuned to the receiver frequency. A similar filter network attaches to the transmission line between receiver and the same antenna junction; the resonant cavity is tuned to receiver frequency and the variable reactance is tuned to the transmitter carrier. The networks are spaced one quarter wavelength from the antenna junction.

6 Claims, 6 Drawing Figures

RADIO FREQUENCY FILTER NETWORK HAVING BANDPASS AND BANDREJECT CHARACTERISTICS

BACKGROUND OF THE INVENTION

This invention relates to the radio frequency filtering art in general and, more particularly, to a filter network comprising generally a bandreject or notch-type filer in combination with a resonant cavity.

Bandreject cavity filters customarily comprise an odd quarter wavelength resonator connected in shunt to the transmission line. They are tuned so that at the junction between the transmission line and cavity filter a short circuit condition exists for the frequency to be rejected. This short circuit condition exists for a relatively narrow band of frequencies; therefore, the rejection notch is relatively sharp and attenuates a narrow band of frequencies compared to a broad band of frequencies of low attenuation. The broad band of frequencies of low attenuation are on either side of the rejection notch so that the selectivity provided to a radio system by a filter of this type is limited essentially to the narrow area of the rejection notch.

Filters of this type are commonly used in the radio communications field, not only as a filter to attenuate discrete frequencies, but also as interconnected groups of filters for the purpose of multi-coupling. A frequently applied type of multi-coupler is the duplexer which allows simultaneous operation on one common antenna of two pieces of equipment operating at different but closely spaced frequencies. Usually the two pieces of equipment are a paired radio transmitter and receiver. In such a case, the duplexer allows energy at the transmitter frequency to flow freely from transmitter to antenna. Likewise, the duplexer allows energy at the receiver frequency to flow freely from antenna to receiver. At the same time, energy flow from the transmitter to the receiver is impeded; and energy received at the antenna is diverted from the transmitter.

For these purposes, the duplexer comprises a number of filters spaced along the transmission line which connects the transmitter to the common antenna terminal, and a number of filters spaced along another transmission line which connects the common antenna terminal to the receiver. The filters on the transmitter side highly attenuate transmitter noise at the receiver frequency and at the same time pass with low attenuation the transmitter carrier. Filters of the prior art generally reject only a narrow a band of energy centered at the receiver frequency. It would be highly desirable for these filters to attenuate not only transmitter noise at the receiver frequency but also transmitter noise over as wide a frequency range as possible. This characteristic would provide not only further protection for the associated receiver but also protection to other receivers in the area which may be operating in nearby frequency ranges.

The filters on the receiver side pass the receiver frequency with low attenuation and at the same time highly attenuate the transmitter carrier frequency. Filters of the prior art generally reject only a narrow band of signals centered at the transmitter frequency. It would be highly desirable for these filters to attenuate not only the transmitter carrier but also other spurious frequencies over as wide a range as possible. This characteristic would provide not only further protection from the associated transmitter but also from other transmitters in the area operating in nearby frequency ranges.

The transmitter carrier frequency and the receiver frequency must be spaced apart enough to allow the duplexer to adequately isolate the receiver from the transmitter noise spectrum falling within the pass band of the receiver. At the same time, it would be desirable to position the carrier and receiver frequencies as close together as possible in order to narrow the band width required by a multi-coupled radio transmitter and receiver system, thereby making it possible for more systems to operate within a specified frequency range in a given area. It is to this end that minimum isolation between the transmitter frequency and the receiver frequency across a given frequency span becomes important. As the frequencies come closer together, more of the transmitter noise spectrum does fall within the pass band of the receiver to adversely affect reception.

SUMMARY OF THE INVENTION

The filter network of this invention is comprised of a high-Q selective odd quarter wavelength cavity element in coupled relationship with a variable reactance. A simple T joint connects the filter network input to a transmission line. The energy coupling loop is not grounded to the cavity wall as in conventional units, but emerges from within the cavity and terminates in a variable reactance. The selective cavity is tuned to resonance to present a high impedance to the frequency which is to be passed along the transmission line, and the variable reactance is tuned to present a low impedance to the frequency to be rejected. Thus, energy in the transmission line approaching the T connection 'sees' between the transmission line and the filter network a low impedance shunt to ground for the frequency to be rejected, and an open circuit for the frequency to be passed.

Attenuation of energy is minimized at the pass frequency by resonance of the cavity so as to form a resonant peak in the frequency response characteristic, and attenuation of the reject frequency energy, by shunting to ground through the variable reactance, is maximized so as to form a notch in the frequency response characteristic. These combined attenuation characteristics are especially suited to duplexing a paired receiver and transmitter where good isolation is desired in combination with close frequency spacing.

In duplexing, a filter network (or a series of filter networks) is attached to the transmission line between transmitter and antenna, tuned optimally to pass transmitter carrier energy to the antenna while rejecting transmitter noise at the receiver's operating frequency. Another similar filter network (or series of networks) is attached to the transmission line between the common antenna and receiver to optimally pass the tuned receiver frequency and to reject the carrier frequency of the paired transmitter.

The transmitter filter network is separated from the antenna connection by a quarter wavelength, measured at the receiver frequency, so that the filter's low impedance shunt to ground at that frequency is 'seen' as an open circuit by the incoming receiver-frequency signal. Thus, a received signal is not diverted to the transmitter.

The receiver filter network is separated from the antenna connection by a quarter wavelength, measured at the transmitter carrier frequency, so that the filter's low impedance shunt to ground at that carrier frequency is 'seen' as an open circuit by the outgoing transmitter carrier. Thus, damage to the receiver and the resonant cavity by transmitter energy is avoided.

OBJECTS OF THE INVENTION

Therefore, it is an object of this invention to provide a filter network having a broader band of attenuation centered at the reject frequency than does the conventional notch filter.

It is a further object of this filter network to provide at the same time a narrower band of pass frequencies than does the conventional notch filter.

Another object of this invention is to provide the filter networks in a duplex arrangement of transmitter and receiver which attenuates transmitter noise over a wider range of frequencies on the transmitter side than does the conventional notch filter.

Still another object of this invention is to provide the filter networks in a duplex arrangement which attenuates spurious frequencies over a wider range of frequencies on the receiver side than does the conventional notch filter.

A further object is to provide the filter networks in a duplex arrangement which provides a greater degree of transmitter to receiver isolation and allows closer frequency spacing.

And yet another object is to provide the foregoing in a relatively simple and inexpensive arrangement which is readily adjusted in the field without special equipment.

Other objects, advantages and novel features of the present invention will become apparent from the following detailed description of the invention when considered in conjunction with the accompanying drawing, in which.

DESCRIPTION OF THE INVENTION

Figure 1:
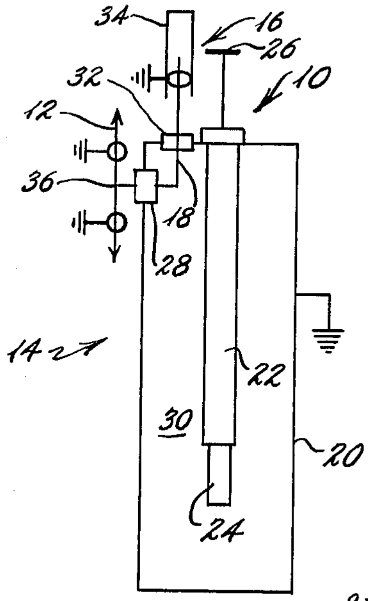
FIG. 1 is a diagrammatic representation of a filter network of this invention to a coaxial transmission line.

FIG. 1 is a diagrammatic representation of the filter network 10 of this invention connected to a coaxial transmission line 12. The filter network 10 is comprised of an odd quarter wavelength high-Q tunable selective cavity 14, tunable reactance 16, and a common coupling loop 18 connecting the cavity 14 and the reactance 16 to the transmission line 12. The purpose of the filter network is to pass energy at a selected frequency, the pass frequency, along the transmission line 12 while at the same time attenuating, by blocking or shunting aside, energy at an undesirable frequency, the reject frequency.

In a manner well known in the art, the selective cavity 14 is comprised of a grounded outer conducting shell 20; an inner conductor having a fixed part 22 and a moving part 24; a tuning knob 26 to extend or retract the moving inner conductor 24; an input connector 28 and a coupling loop extending from the input connector 28 through the wall of the outer shell 20 and into the internal space 30 of the cavity 14. The coupling loop 18, as a continuous element, leaves the shell 20 via an output connector 32. Both connectors 28,32 electrically isolate the coupling loop 18 from the grounded outer shell 20. The coupling loop 18 after leaving the cavity space 30 connects to the input of the variable reactance 16, shown in FIG. 1 as a small section of a coaxial transmission line 34 of variable length. The coupling loop attaches to the central conductor of the coaxial section 34; the outer conductor of the section 34 is grounded. The filter network 10 joins to the central conductor of the coaxial transmission line 12 by a simple T connection 36. The outer conductor of the transmission line 12 is grounded in the conventional manner.

Note that the coupling loop 18 is not grounded to the cavity shell 20 as in the conventional selective cavity. Instead, the loop 18 is terminated in a variable reactance 16 which is illustrated in FIG. 1 as an adjustable length of coaxial line 34. The variable reactance 16, in an alternative embodiment, may be a variable inductor or capacitor or other means of tunable reactance.

The selective cavity 14 is tuned to the pass frequency by the conventional tuning means 26. The variable reactance 16 is tuned by adjusting the length of the coaxial line 34 for the desired reject frequency. With this filter there is no need for a coupling line between the cavity 14 and the transmission line 12. The variable reactance 16 creates a virtual short circuit (low impedance) condition at the desired reject frequency directly at the input terminal 28 of the filter network 10. Likewise, tuning the selective cavity 14 to the pass frequency produces an open circuit (high impedance) condition at the pass frequency directly at the input terminal 28 of the filter network 10.

Figure 2:
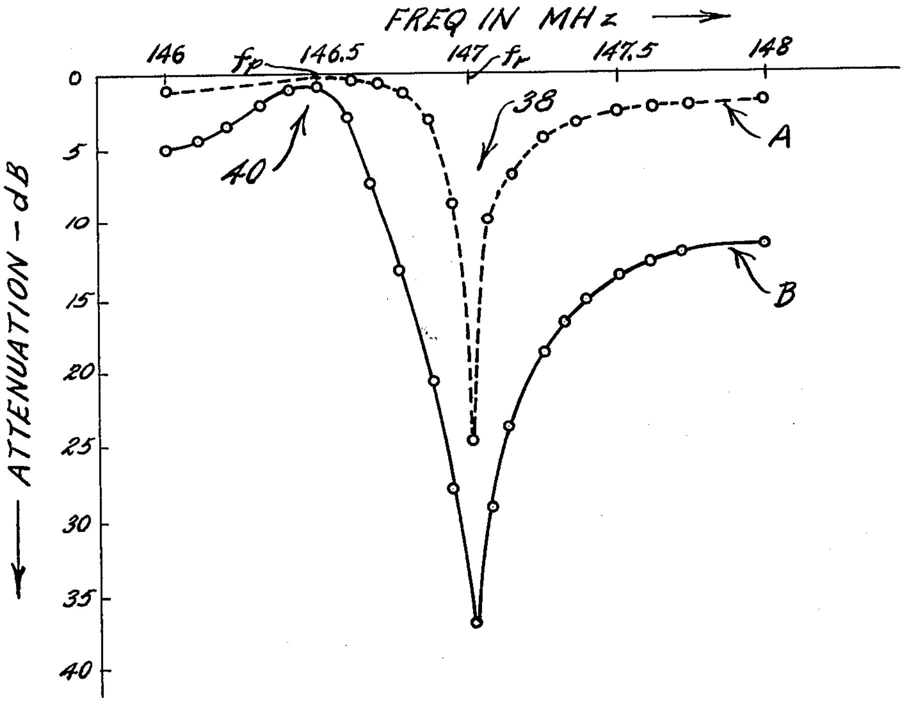
FIG. 2 is a graphical representation comparing the frequency response performance of a filter network of this invention with that of a conventional notch filter.

The attenuation characteristics versus frequency of a conventional notch filter are shown in FIG. 2, curve A, where $f_p$ is the desired pass frequency and $f_r$ is the desired reject frequency. A relatively narrow notch 38 of high attenuation is obtained with the high attenuation levels being confined to a small increment of the frequency spectrum. The frequency spectrum of the pass band, with little attenuation, includes a large band of frequencies on either side of the notch. By comparing these results with the attenuation characteristics, curve B, of the filter network 10 of this invention, the advantages of this invention become evident. Note that the desired reject frequency $f_r$ is attenuated to a greater degree with the filter network 10 than it is with the conventional notch filter. Also, note that the high attenuation levels comprise a much broader frequency spectrum, offering more protection from other frequencies of possible interference. The band of pass frequencies is peaked 40, rather than flat, enabling the filter network 10 to offer more selectivity in terms of passing only the desired pass frequency.

The conventional notch filter is tuned to resonance to create a short circuit condition across the transmission line at the desired reject frequency $f_r$. The impedance characteristics (curve A, FIG. 2) of the conventional notch filter are such that this short circuit condition exists only for a narrow band of frequencies. As the frequency is varied to either side of the notch frequency, the impedance moves rapidly to a high level. The high level of impedance exists over a large frequency span and produces the broad generally flat pass band of the notch filter.

On the filter network 10, of this invention the tunable reactance 16 performs in a manner producing a notched characteristic (curve B, FIG. 2) similar to the conventional notch filter described above. However, the cavity 14 which is tuned to, and presents a maximum impedance to, the pass frequency, $f_p$ is detuned and presents a lowered impedance relative to the reject frequency. Thus, for example, as the frequency increases beyond the reject frequency band, the impedance of the reactance 16 is increasing rapidly but simultaneously the impedance of the cavity 14 is decreasing. The result is a deeper and broader rejection notch because both the cavity 14 and the reactance 16 shunt energy to ground and provide a generally greater attenuation at all frequencies except when the tuned cavity 14 provides a peak 40 in the characteristic at the pass frequency.

It is noteworthy that the data used to prepare curve A of FIG. 2 was compiled using a conventional odd quarter wavelength selective cavity, with a coupling loop grounded to the shell, as a conventional notch filter. The data for curve B of FIG. 2 was compiled after the very same cavity was modified to put a variable reactance between the coupling loop and ground as disclosed herein.

Figure 3:
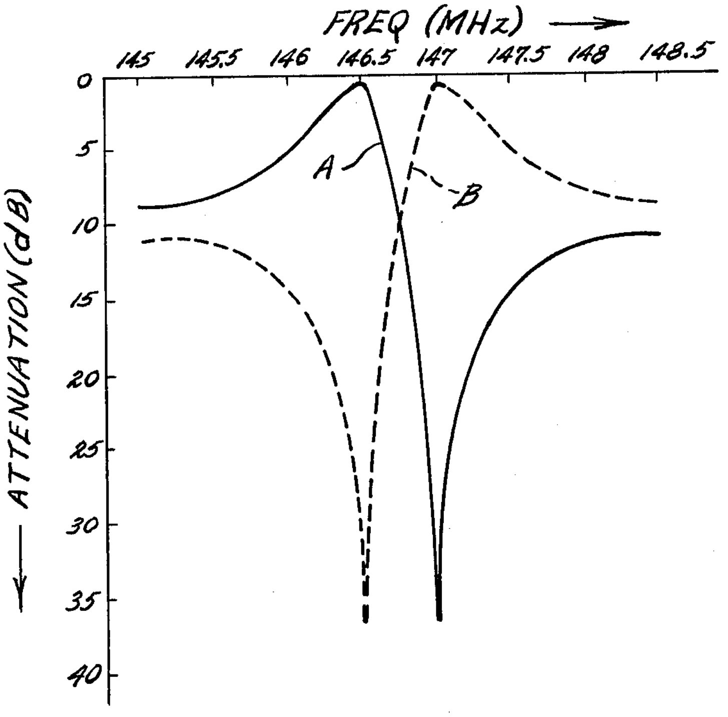
FIG. 3 is a graphical representation of the attenuation characteristics of the filter network of this invention illustrating the ability to notch either side of the pass frequency.

With reference to FIG. 3, the reactance network 16 is tuned to position the notch at a desired notch frequency whether the reject frequency is higher (curve A) than, or lower (curve B) than, the pass frequency. The two attenuation characteristic curves are essentially mirror images of each other. The difference in the two filter networks required to reverse the relationship between peak and notch is the amount of reactance introduced by the tunable reactance.

Figure 4:
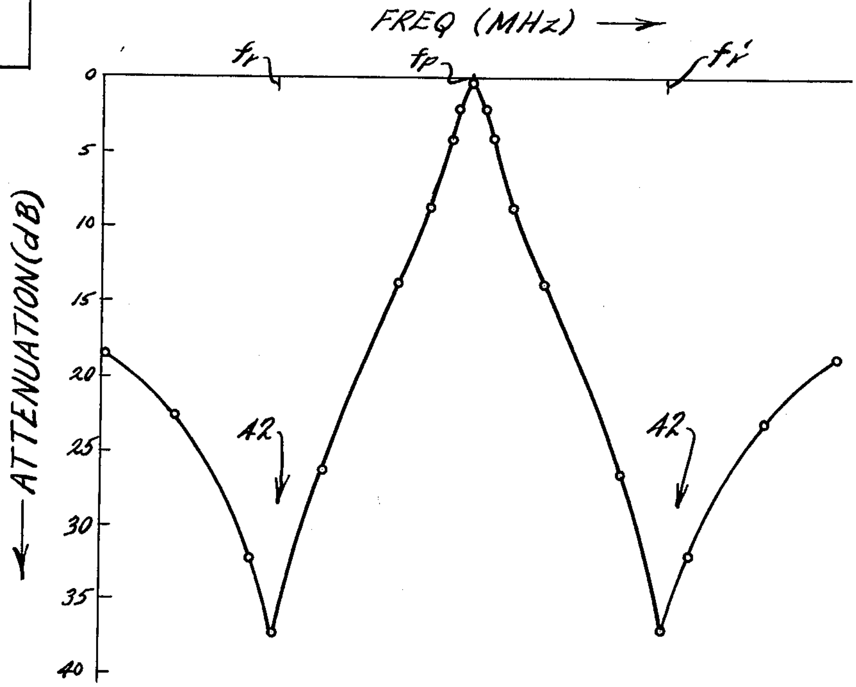
FIG. 4 is a graphical representation of the attenuation characteristics of the filter network of this invention showing two reject notches symmetrically displaced about the peaked pass frequency.

Additionally, the filter network 10 of this invention produces two notch areas in close proximity to the pass frequency, for one tuning of cavity and reactance. The notch areas are on either side of the pass frequency. FIG. 4 shows the attenuation curve of the filter network 10 of this invention when the variable reactance 16 is tuned to locate the two notches 42 symmetrically about the pass frequency $f_p$. The total frequency span between these two notches 42 remains essentially constant for a given amount of coupling into the cavity 14. Therefore, as the reactance network 16 is tuned to locate one of the notches 42 closer to the pass frequency, $f_p$ the other notch 42 necessarily is positioned farther from the pass frequency. This provides the capability to define a particular pass band of frequencies with high levels of attenuation on either side. The total frequency span between the two notches 42 can be altered by changing the degree of coupling into the cavity 14. As the coupling is changed in the known manner to increase the insertion loss (loose coupling) at the pass frequency, the two notches 42 will move closer together. This performance becomes of particular significance when multicoupling several closely spaced frequencies.

Figure 5:
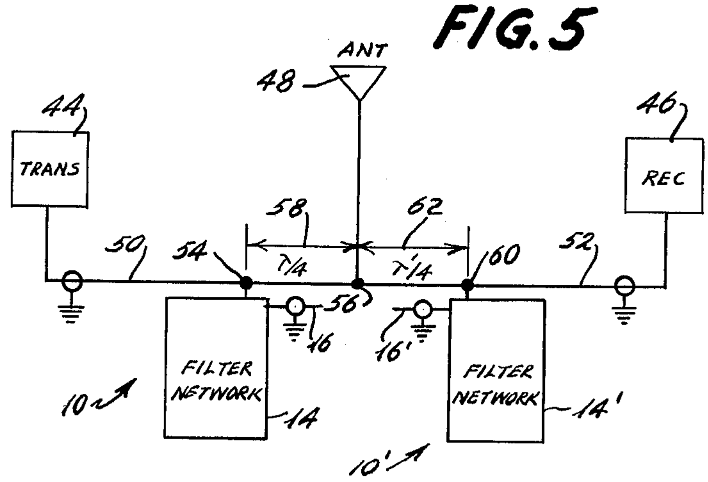
FIG. 5 is a diagrammatic representation of a transmitter-receiver duplexer arrangement utilizing filter networks of this invention.

FIG. 5 illustrates a duplex arrangement of transmitter 44, receiver 46 and common antenna 48, utilizing filter networks 10,10' of this invention. Prime markings (') are used to identify the filter network 10' in the receiver circuits which network 10' is physically identical to the filter network 10 in the transmitter circuit. A transmitter 44 with a carrier frequency of $F_T$ is connected to an antenna by a first transmission line 50, and a receiver 46 on frequency $F_R$ is connected to the same antenna 48 by a second transmission line 52. The filter network 10 of this invention on the transmitter side serves to pass the transmitter carrier $F_T$, and reject the transmitter noise at the receiver frequency $F_R$. To effect this characteristic the cavity 14 is tuned to pass $F_T$ and the reactance 16 is tuned to reject $F_R$ as described previously. On the receiver side the filter network 10' serves to pass the receiver frequency $F_R$ and reject the transmitter carrier $F_T$. Therefore, the cavity 14' is tuned to pass $F_R$ and the reactance 16' is tuned to reject $F_T$.

The filter network 10 in the transmitter side creates at its junction 54 in the transmitter transmission line 50 a short circuit condition at the receiver frequency $F_R$. To avoid loss of incoming receiver signals the filter network 10 is located a quarter wavelength 58, measured at receiver frequency $F_R$, from the common antenna terminal 56. Because of the well known quarter wavelength transforming action, the short circuit condition of the filter network 10 at $F_R$ now appears as an open circuit condition at the antenna junction 56. This insures that a minimum of receiver frequency energy enters into the transmitter line 50 but instead the antenna energy flows into the receiver transmission line 52 and results in less loss of energy at the receiver 46.

Likewise, the filter network 10' in the receiver side creates a short circuit condition at its junction 60 in the receiver transmission line 52 at the transmitter frequency $F_T$. This short circuit condition is similarly transformed into an open circuit condition at the antenna terminal 56 by use of a quarter wavelength 62 of transmission line measured at the transmitter frequency, $F_R$ between the antenna terminal 56 and the junction 60 of filter network attachment. Now the transmitter frequency energy sees a very high impedance in the direction of the receiver 46 and, flows in the direction of the antenna 48 as is well known in the duplexer art.

Figure 6:
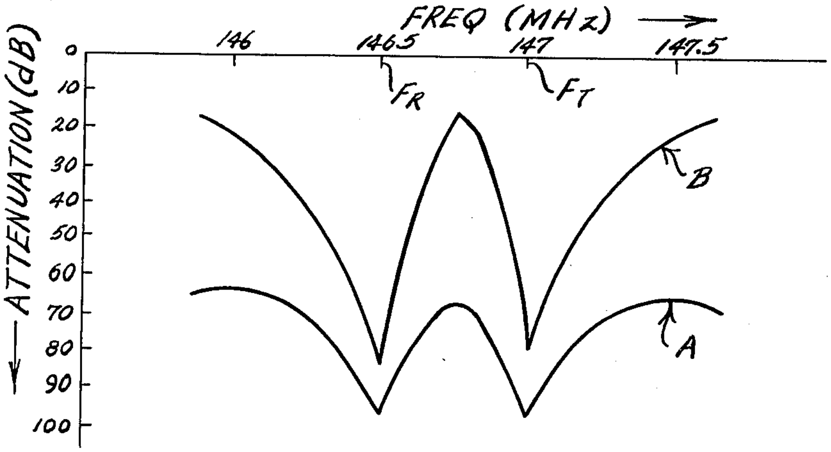
FIG. 6 is a graphical representation comparing the receiver isolation of a duplexer using filter networks of this invention with that of a duplexer using conventional notch filters.

FIG. 6 shows the attenuation characteristics between the transmitter and receiver of a duplexer as 'seen' from the filter terminal of the receiver transmission line in an application utilizing the filter networks 10,10' of this invention (curve A). This characteristic is compared to a duplexer utilizing conventional notch filters (curve B). The advantages of the duplexer with the filter networks 10,10' of this invention become evident upon comparison of these two curves wherein greater attenuation is provided at every frequency by the networks 10,10' of this invention. Of particular interest is the greater attenuation level obtained at frequencies between the transmitter frequency indicated as $F_T$ and the receiver frequencies indicated at $F_R$. The duplexer with the filter networks 10,10' of this invention not only provides greater protection for the receiver 46, but also allows the transmitter and receiver frequencies to be spaced more closely than before.

What is claimed is:

1. A filter network for connection to a transmission line of radio frequency energy, said filter network designed to selectively pass one frequency and selectively reject another frequency comprising in combination:

an odd quarter wavelength resonator including an outer shell connected to ground and an internal coupling loop, said coupling loop beng ungrounded and having a first point of contact at said outer shell for connection to said transmission line, said resonator being tuned to resonate and present generally maximum impedance at the frequency to be passed; and variable reactance means connected in series relationship between said ground and a second point of contact of said ungrounded, internal coupling loop at said outer shell, said reactance means being tuned to maximize shunting there-through to said ground of said radio frequency energy at the frequency to be rejected.

2. A filter network of claim 1 wherein said transmission line comprises a coaxial cable.

3. A filter network of claim 1 wherein the reactance means comprises a variable length of coaxial transmission line.

4. A filter network of claim 1 wherein said resonator comprises a high-Q selective cavity.

5. A filter network of claim 1 wherein an extension of said internal coupling loop protrudes externally of said outer shell and said second point of contact is external.

6. A duplexer network for operation of a radio transmitter and receiver comprising:

a common antenna;

a first transmission line connecting said antenna to said transmitter;

a second transmission line connecting said antenna to said receiver;

a first filter network of claim 1 connected to said first transmission line at a first distance from said connection of said first transmission line to said antenna, said first filter network being tuned to pass the carrier frequency of said transmitter and shunt off the operating frequency of said receiver, said first distance being one quarter wavelength of the operating frequency of said receiver; and a second filter network of claim 1 connected to said second transmission line at a second distance from said connection of said second transmission line to said antenna, said second filter network being tuned to pass the receiver operating frequency and shunt off the transmitter carrier frequency, said second distance being one quarter wavelength of the carrier frequency of said transmitter.

* * * * *